(12) United States Patent
Song et al.

(10) Patent No.: US 7,935,970 B2
(45) Date of Patent: May 3, 2011

(54) NITRIDE SEMICONDUCTOR LIGHT EMITTING DIODE

(75) Inventors: Sang-Yeob Song, Suwon-si (KR); Ji Hye Shim, Suwon-si (KR); Bum Joon Kim, Seoul (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 70 days.

(21) Appl. No.: 12/258,292

(22) Filed: Oct. 24, 2008

(65) Prior Publication Data

US 2009/0095965 A1   Apr. 16, 2009

Related U.S. Application Data

(62) Division of application No. 11/692,660, filed on Mar. 28, 2007, now abandoned.

(30) Foreign Application Priority Data

Aug. 29, 2006  (KR) .................. 10-2006-0082374

(51) Int. Cl.
*H01L 27/15* (2006.01)
(52) U.S. Cl. ........ 257/79; 257/94; 257/97; 257/E33.061
(58) Field of Classification Search .......... 257/79, 257/E33.061, 94, 97
See application file for complete search history.

(56) References Cited

U.S. PATENT DOCUMENTS

| | | | |
|---|---|---|---|
| 4,928,285 A | 5/1990 | Kushibe et al. | |
| 5,751,021 A * | 5/1998 | Teraguchi | 257/103 |
| 5,998,232 A | 12/1999 | Maruska | |
| 6,084,899 A | 7/2000 | Shakuda | |
| 6,335,546 B1 | 1/2002 | Tsuda et al. | |
| 6,492,660 B2 | 12/2002 | Uchida | |
| 6,576,933 B2 | 6/2003 | Sugawara et al. | |
| 7,084,420 B2 | 8/2006 | Kim et al. | |
| 2006/0086932 A1* | 4/2006 | Kim et al. | 257/13 |

FOREIGN PATENT DOCUMENTS

| | | |
|---|---|---|
| JP | 09321389 A | 12/1997 |
| JP | 11054840 A | 2/1999 |
| JP | 2006-066641 A | 3/2006 |
| JP | 2006128607 A | 5/2006 |
| KR | 10-448351 | 2/2004 |
| KR | 10-2006-0036713 A | 5/2006 |

OTHER PUBLICATIONS

F. Perjeru, X.Bai, M.I. Ortiza-Libreros, M.E. Kordesch "Characterization of SCN Heterojunctions" 2000 IEEE.
Japanese Office Action for application No. 2007-104244, mailed Jun. 1, 2010.
Office Action of U.S. Appl. No. 12/258,328, mailed Dec. 30, 2010.

* cited by examiner

*Primary Examiner* — David Vu
*Assistant Examiner* — Brandon Fox
(74) *Attorney, Agent, or Firm* — Lowe Hauptman Ham & Berner LLP

(57) ABSTRACT

A nitride semiconductor light emitting diode (LED) comprises an n-type nitride semiconductor layer; an electron emitting layer formed on the n-type nitride semiconductor layer, the electron emitting layer being composed of a nitride semiconductor layer including a transition element of group III; an active layer formed on the electron emitting layer; and a p-type nitride semiconductor layer formed on the active layer.

4 Claims, 5 Drawing Sheets

[FIG. 1]
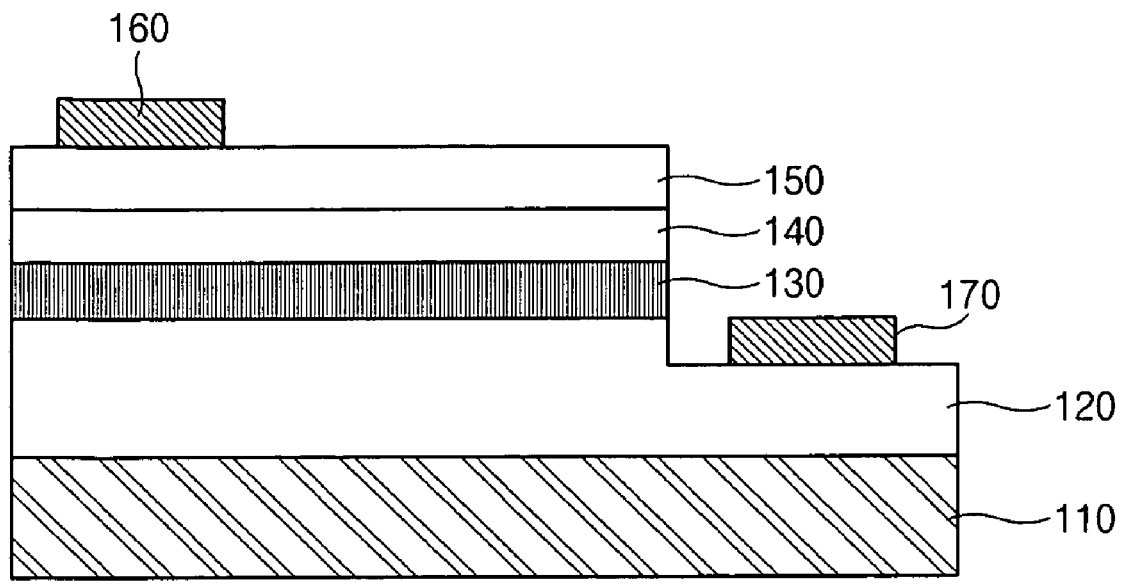
[FIG. 2]
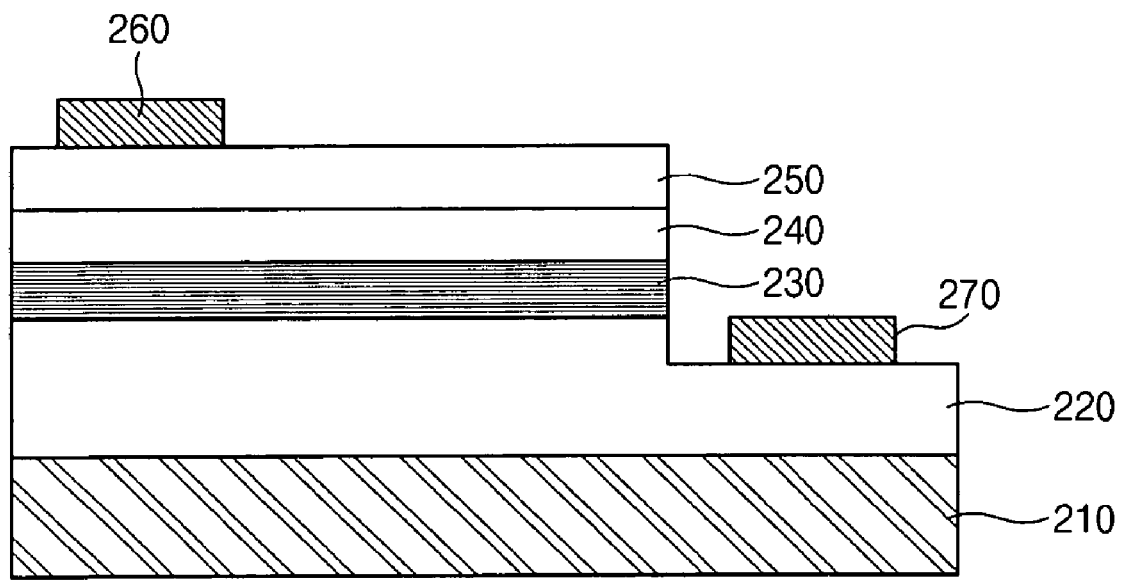

[FIG. 3]
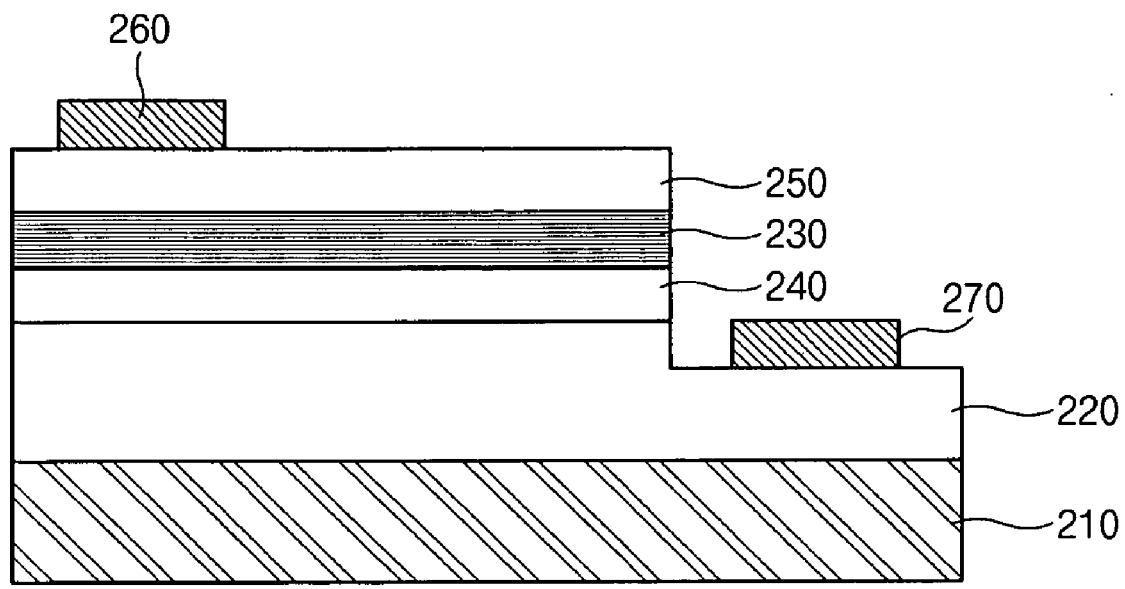

[FIG. 4]
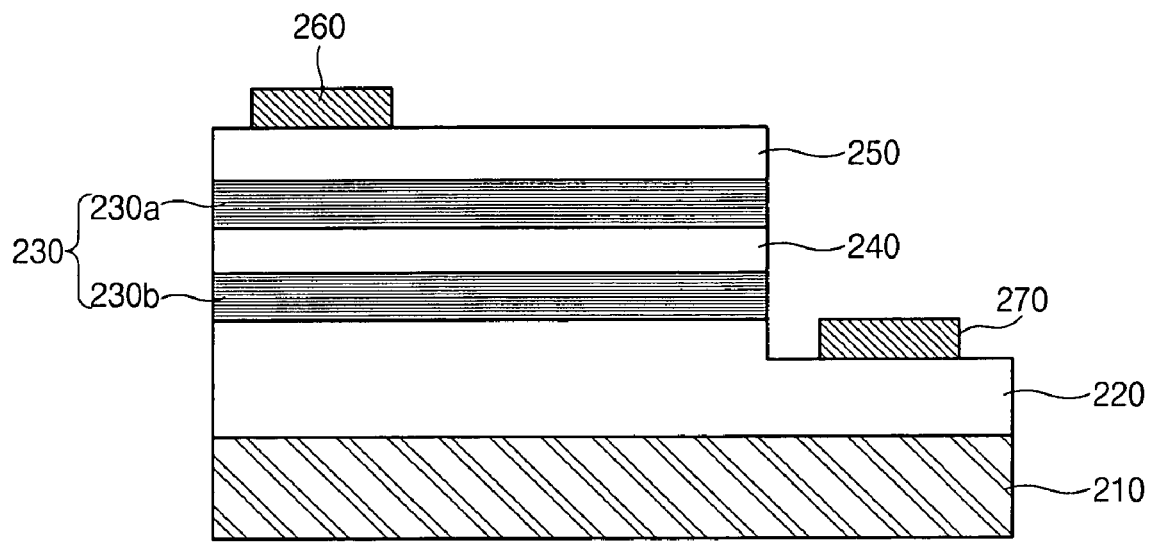
[FIG. 5]
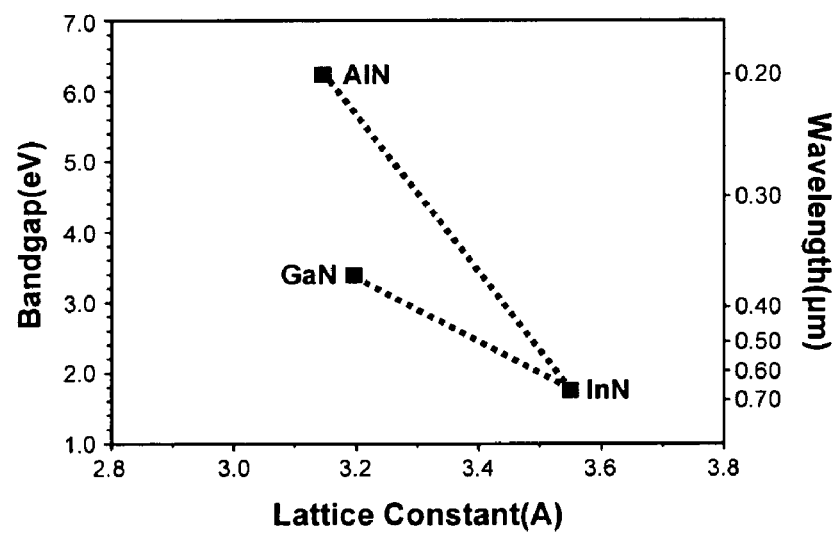

[FIG. 6]
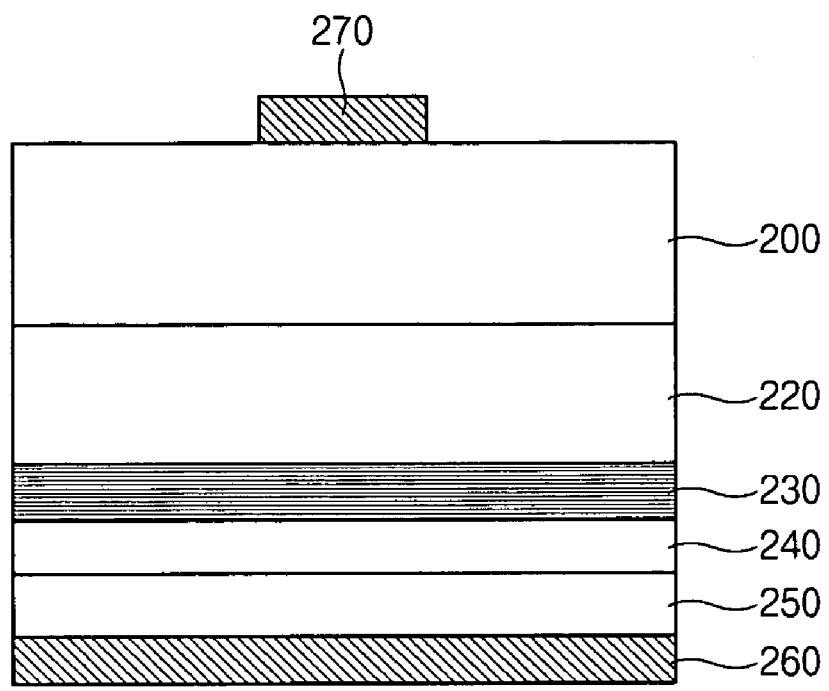
[FIG. 7]
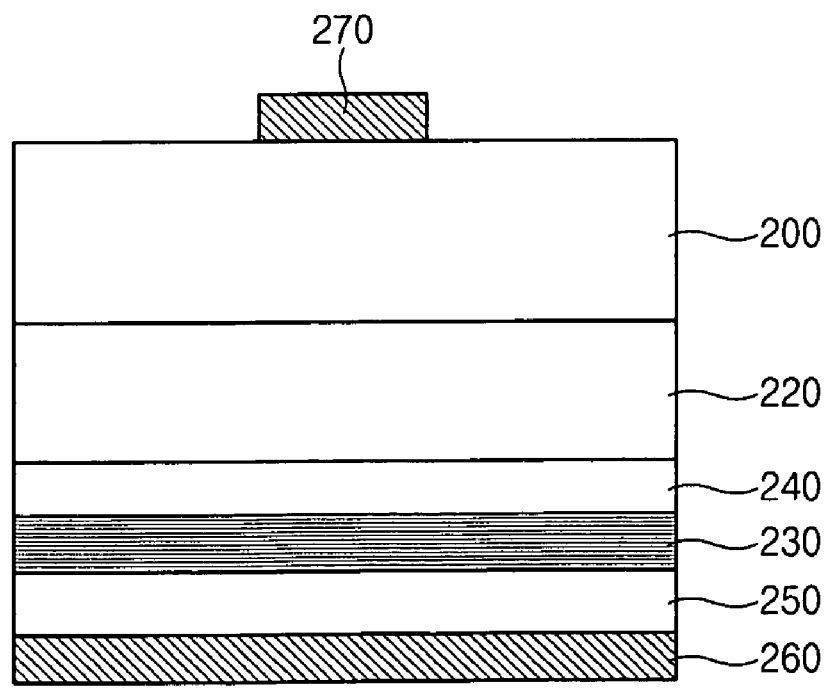

[FIG. 8]
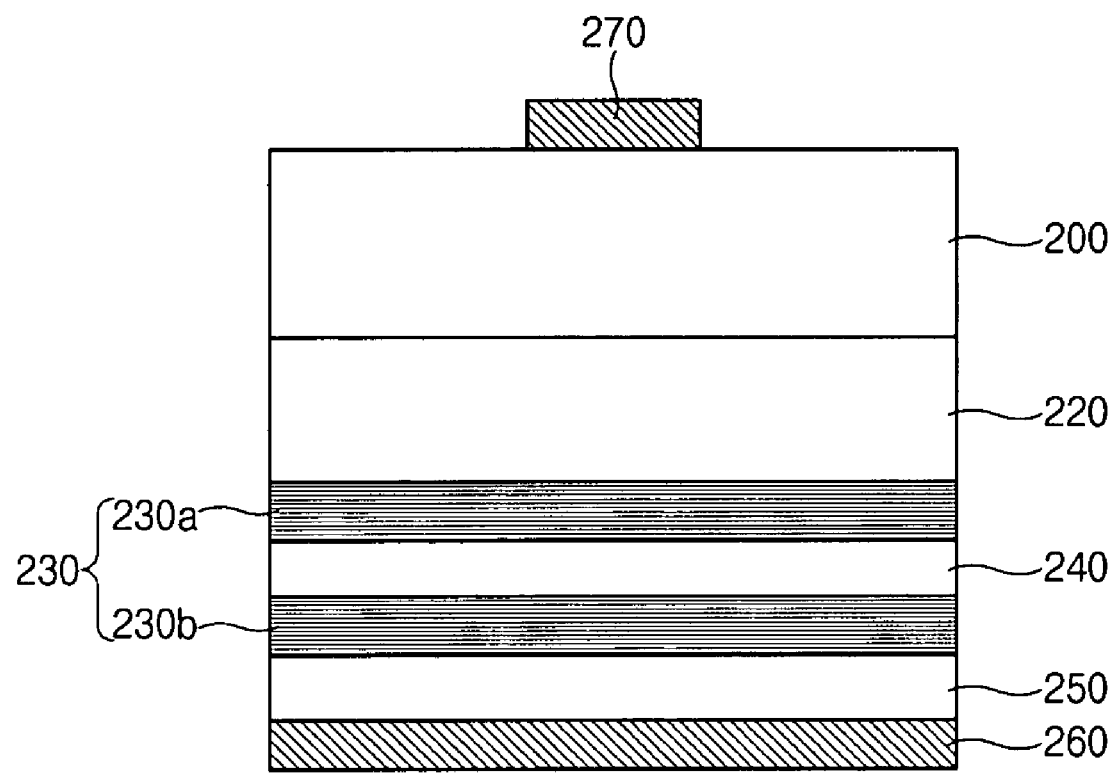

NITRIDE SEMICONDUCTOR LIGHT EMITTING DIODE

CROSS-REFERENCE TO RELATED APPLICATIONS

The present application is a division of U.S. application Ser. No. 11/692,660, filed Mar. 28, 2007, which claims priority from, Korean Application Number 10-2006-0082374, filed Aug. 29, 2006, the disclosures of which are hereby incorporated by reference herein in their entirety.

BACKGROUND OF THE INVENTION

1. Field of the Invention

The present invention relates to a nitride semiconductor light emitting diode (LED) in which an electron emitting layer having excellent crystallinity is grown so that light emission efficiency and ESD (electrostatic discharge) characteristic of the LED can be enhanced.

2. Description of the Related Art

Generally, nitride semiconductors are widely used in green or blue light emitting diodes which are provided as light sources in full-color displays, image scanners, various signal systems, and optical communication equipments. Such a nitride semiconductor LED includes an active layer disposed between n-type and p-type nitride semiconductor layers, the active layer having a single quantum well (SQW) structure or a multi-quantum well (MQW) structure. In the active layer, electrons and holes are recombined so as to generate and emit light.

Hereinafter, a conventional nitride semiconductor LED will be described in detail with reference to FIG. 1.

FIG. 1 is a sectional view illustrating the structure of the conventional nitride semiconductor LED. As shown in FIG. 1, the nitride semiconductor LED includes an optically-transparent sapphire substrate 110, an n-type nitride semiconductor layer 120, an active layer 140 containing InGaN with a single quantum well (SQW) structure or a multi-quantum well (MQW) structure, and a p-type nitride semiconductor layer 150, which are sequentially laminated on the sapphire substrate 110.

Portions of the p-type nitride semiconductor layer 150 and the active layer 140 are removed by mesa-etching such that a portion of the upper surface of the n-type nitride semiconductor layer 120 is exposed. Further, on the exposed upper surface of the exposed n-type nitride semiconductor layer 120, a negative electrode (n-electrode) is formed. On the surface of the p-type nitride semiconductor layer 150, a positive electrode (p-electrode) is formed.

In the multi-quantum well structure having a plurality of mini-bands, the efficiency thereof is excellent, and light emission can be performed by using a small current. Therefore, the multi-quantum well structure has a larger light-emission output than the single quantum well structure, which makes it possible to expect the enhancement of diode characteristics.

In such a conventional nitride semiconductor LED, an electron emitting layer 130 composed of an InGaN/GaN layer is formed between the active layer 140 and the n-type nitride semiconductor layer 120. The InGaN layer and the GaN layer increase an effective electron number, which is smaller than an effective hole number, by using a tunneling effect, thereby effectively serving as the electron emitting layer 130 which increases a probability of capturing carriers in the active layer 140.

Such an electron emitting layer 130 increases a lattice period through a plurality of slim InGaN/GaN layers. Therefore, the electron emitting layer 130 reduces a driving voltage and increases light-emission efficiency, thereby having a good effect on ESD characteristics.

However, when the InGaN layer is grown, it is difficult to adjust gas pressure, because equilibrium vapor pressure of In is extremely high and equilibrium vapor pressure of $NH_4$ serving as a source gas of N is low. Further, in order to obtain an InGaN layer having excellent crystallinity, the InGaN layer should be grown at high temperature of more than 1000° C. In such a temperature condition, however, most of In is vaporized, which makes it difficult to produce InN. Further, when the temperature is decreased, the quality of InGaN is severely degraded. Therefore, it is very difficult to produce an InGaN layer with a high quality.

Therefore, in this technical field, a new method is being required, in which an electron emitting layer with excellent crystallinity is obtained so that light-emission efficiency and ESD characteristics of an LED can be enhanced.

SUMMARY OF THE INVENTION

An advantage of the present invention is that it provides a nitride semiconductor LED in which an electron emitting layer having excellent crystallinity is grown so that light emission efficiency and ESD (electrostatic discharge) characteristic of an LED can be enhanced.

Additional aspect and advantages of the present general inventive concept will be set forth in part in the description which follows and, in part, will be obvious from the description, or may be learned by practice of the general inventive concept.

According to an aspect of the invention, a nitride semiconductor light emitting diode (LED) comprises an n-type nitride semiconductor layer; an electron emitting layer formed on the n-type nitride semiconductor layer, the electron emitting layer being composed of a nitride semiconductor layer including a transition element of group III; an active layer formed on the electron emitting layer; and a p-type nitride semiconductor layer formed on the active layer.

According to another aspect of the invention, the electron emitting layer is composed of at least one $Ga_xSc_{(1-x)}N/Al_yGa_{(1-y)}N$ layer ($0 \leq x < 1$ and $0 \leq y < 1$).

According to a further aspect of the invention, the thicknesses of the $Ga_xSc_{(1-x)}N$ layer and the $Al_yGa_{(1-y)}N$ layer composing the electron emitting layer are equal to or different from each other.

According to a still further aspect of the invention, when the electron emitting layer is composed of more than two $Ga_xSc_{(1-x)}N/Al_yGa_{(1-y)}N$ layers ($0 \leq x < 1$ and $0 \leq y < 1$), the thicknesses of the respective $Ga_xSc_{(1-x)}N$ layers composing the electron emitting layer are equal to or different from each other.

According to a still further aspect of the invention, the $Ga_xSc_{(1-x)}N$ layer and the $Al_yGa_{(1-y)}N$ layer composing the electron emitting layer are not doped with impurities.

According to a still further aspect of the invention, all or some of the $Ga_xSc_{(1-x)}N/Al_yGa_{(1-y)}N$ layers ($0 \leq x < 1$ and $0 \leq y < 1$) composing the electron emitting layer are doped with n-type impurities.

According to a still further aspect of the invention, the $Ga_xSc_{(1-x)}N$ layer and the $Al_yGa_{(1-y)}N$ layer composing the electron emitting layer are doped with the n-type impurities in the same concentration or different concentration.

According to a still further aspect of the invention, the electron emitting layer is composed of at least one $Ga_xY_{(1-x)}N/Al_yGa_{(1-y)}N$ layer ($0 \leq x < 1$ and $0 \leq y < 1$).

According to a still further aspect of the invention, the nitride semiconductor LED further comprises another electron emitting layer formed between the active layer and the p-type nitride semiconductor layer, the electron emitting layer being composed of a nitride semiconductor layer including a transition element of group III.

According to a still further aspect of the invention, a nitride semiconductor LED comprises an n-type nitride semiconductor layer; an active layer formed on the n-type nitride semiconductor layer; an electron emitting layer formed on the active layer, the electron emitting layer being composed of a nitride semiconductor layer including a transition element of group III; and a p-type nitride semiconductor layer formed on the electron emitting layer.

According to a still further aspect of the invention, a nitride semiconductor LED comprises a substrate; an n-type nitride semiconductor layer formed on the substrate; an electron emitting layer formed on a portion of the n-type nitride semiconductor layer, the electron emitting layer being composed of a nitride semiconductor layer including a transition element of group III; an active layer formed on the electron emitting layer; a p-type nitride semiconductor layer formed on the active layer; a p-electrode formed on the p-type nitride semiconductor layer; and an n-electrode formed on the n-type nitride semiconductor layer where the electron emitting layer is not formed.

According to a still further aspect of the invention, a nitride semiconductor LED comprises a substrate; an n-type nitride semiconductor layer formed on the substrate; an active layer formed on a portion of the n-type nitride semiconductor layer; an electron emitting layer formed on the active layer, the electron emitting layer being composed of a nitride semiconductor layer including a transition element of group III; a p-type nitride semiconductor layer formed on the electron emitting layer; a p-electrode formed on the p-type nitride semiconductor layer; and an n-electrode formed on the n-type nitride semiconductor layer where the active layer is not formed.

According to a still further aspect of the invention, a nitride semiconductor LED comprises a p-electrode; a p-type nitride semiconductor layer formed on the p-electrode; an active layer formed on the p-type nitride semiconductor layer; an electron emitting layer formed on the active layer, the electron emitting layer being composed of a nitride semiconductor layer including a transition element of group III; an n-type nitride semiconductor layer formed on the electron emitting layer; a substrate formed on the n-type nitride semiconductor layer; and an n-electrode formed on the substrate.

According to a still further aspect of the invention, a nitride semiconductor LED comprises a p-electrode; a p-type nitride semiconductor layer formed on the p-electrode; an electron emitting layer formed on the p-type nitride semiconductor layer, the electron emitting layer being composed of a nitride semiconductor layer including a transition element of group III; an active layer formed on the electron emitting layer; an n-type nitride semiconductor layer formed on the active layer; a substrate formed on the n-type nitride semiconductor layer; and an n-electrode formed on the substrate.

According to a still further aspect of the invention, the substrate is any one selected from the group consisting of a GaN substrate, an SiC substrate, a ZnO substrate, and a conductive substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view illustrating the structure of a conventional nitride semiconductor LED;

FIGS. 2 to 4 are sectional views illustrating the structure of a nitride semiconductor LED according to a first embodiment of the invention;

FIG. 5 is a graph showing bandgap energy of AlN and GaN; and

FIGS. 6 to 8 are sectional views illustrating the structure of a nitride semiconductor LED according to a second embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, embodiments of the present invention will be described in detail with reference to the accompanying drawings.

First Embodiment

Referring to FIGS. 2 to 5, a nitride semiconductor LED according to a first embodiment of the invention will be described in detail.

FIGS. 2 to 4 are sectional views illustrating the structure of the nitride semiconductor LED according to the first embodiment of the invention, showing an example of a lateral nitride semiconductor LED.

As shown in FIG. 2, the nitride semiconductor LED according to the first embodiment includes a substrate 210, an n-type nitride semiconductor layer 220, an electron emitting layer 230, an active layer 240, and a p-type nitride semiconductor layer 250, which are sequentially formed on the substrate 210.

Preferably, the substrate 210 is formed of a transparent material including sapphire. In addition to sapphire, the substrate 210 may be formed of zinc oxide (ZnO), gallium nitride (GaN), silicon carbide (SiC), or aluminum nitride (AlN).

Between the substrate 210 and the n-type nitride semiconductor layer 220, a buffer layer (not shown) for enhancing lattice matching therebetween may be formed. The buffer layer may be formed of GaN or AlN/GaN.

The n-type and p-type nitride semiconductor layers 220 and 250 and the active layer 240 can be formed of a semiconductor material having a compositional formula of $Al_y In_x Ga_{(1-x-y)}N$ (here, $0 \leq x$, $0 \leq y$, and $x+y \leq 1$). More specifically, the n-type nitride semiconductor layer 220 can be formed of a GaN or GaN/AlGaN layer doped with n-type conductive impurities. For example, the n-type conductive impurities may be Si, Ge, Sn and the like, among which Si is preferably used. Further, the p-type nitride semiconductor layer 250 can be formed of a GaN or GaN/AlGaN layer doped with p-type conductive impurities. For example, the p-type conductive impurities may be Mg, Zn, Be and the like, among which Mg is preferably used. The active layer 240 can be formed of an InGaN/GaN layer with a multi-quantum well structure.

Portions of the p-type nitride semiconductor layer 250, the active layer 240, and the electron emitting layer 230 are removed by mesa-etching such that a portion of the n-type nitride semiconductor layer 220 is exposed. That is, the p-type nitride semiconductor layer 250, the active layer 240, and the electron emitting layer 230 are formed on a portion of the n-type nitride semiconductor layer 220.

On the p-type nitride semiconductor layer 250, a p-electrode 260 is formed.

On the n-type nitride semiconductor layer 220 exposed by mesa-etching, an n-electrode 270 is formed.

In such a nitride semiconductor LED according to the invention, the electron emitting layer 230 is formed between the n-type nitride semiconductor layer 220 and the active layer 240.

Particularly, the electron emitting layer 230 may be formed of a nitride semiconductor layer including a transition element of group III.

As for the transition element of group III, Sc (scandium) or the like forming a compound with N (nitride) can be used. The nitride semiconductor layer including Sc may have a super lattice structure composed of at least one $Ga_xSc_{(1-x)}N/Al_yGa_{(1-y)}N$ layer ($0 \leq x < 1$ and $0 \leq y < 1$). That is, the electron emitting layer 230 can be composed of one $Ga_xSc_{(1-x)}N/Al_yGa_{(1-y)}N$ layer ($0 \leq x < 1$ and $0 \leq y < 1$) or can be formed by laminating more than two $Ga_xSc_{(1-x)}N/Al_yGa_{(1-y)}N$ layers ($0 \leq x < 1$ and $0 \leq y < 1$).

Such an electron emitting layer 230 increases a lattice period and forms a mini-band through the plurality of slim $Ga_xSc_{(1-x)}N/Al_yGa_{(1-y)}N$ layers ($0 \leq x < 1$ and $0 \leq y < 1$). Therefore, the electron emitting layer 230 reduces a driving voltage and increases light emission efficiency, thereby having a good effect on ESD characteristics.

In other words, the electron emitting layer 230 secures a high carrier mobility due to a bandgap difference between $Ga_xSc_{(1-x)}N$ layer and $Al_yGa_{(1-y)}N$ layer, thereby enhancing a current spreading effect. When a current spreading effect is enhanced, a driving voltage of an LED is reduced and light emission efficiency increases so that the magnitude of ESD protection voltage increases.

When the electron emitting layer 230 is formed by laminating more than two $Ga_xSc_{(1-x)}N/Al_yGa_{(1-y)}N$ layers ($0 \leq x < 1$ and $0 \leq y < 1$), compositional ratios of Ga and Sc within $Ga_xSc_{(1-x)}N$ forming the respective layers may differ from each other, and compositional ratios of Al and Ga within $Al_yGa_{(1-y)}N$ forming the respective layers may differ from each other. Further, when the electron emitting layer 230 is formed by laminating more than two $Ga_xSc_{(1-x)}N/Al_yGa_{(1-y)}N$ layers ($0 \leq x < 1$ and $0 \leq y < 1$) as described above, the thicknesses of the respective $Ga_xSc_{(1-x)}N$ layers composing the electron emitting layer 230 may be equal to or different from each other.

Further, in the $Ga_xSc_{(1-x)}N/Al_yGa_{(1-y)}N$ layer ($0 \leq x < 1$ and $0 \leq y < 1$) composing the electron emitting layer 230, the thicknesses of the $Ga_xSc_{(1-x)}N$ layer and the $Al_yGa_{(1-y)}N$ layer may be equal to or different from each other. At this time, considering a tunneling effect in the electron emitting layer 230, it is preferable that the thickness of the $Ga_xSc_{(1-x)}N/Al_yGa_{(1-y)}N$ layer ($0 \leq x < 1$ and $0 \leq y < 1$) is set to be equal to or less than 100 Å. More preferably, the thickness is set to be equal to or less than 70 Å or 50 Å.

Preferably, all or some of the $Ga_xSc_{(1-x)}N/Al_yGa_{(1-y)}N$ layers composing the electron emitting layer 230 are doped with n-type impurities. However, the $Ga_xSc_{(1-x)}N$ layer and the $Al_yGa_{(1-y)}N$ layer may not be doped with impurities.

When the $Ga_xSc_{(1-x)}N/Al_yGa_{(1-y)}N$ layer is doped with n-type impurities, the doping concentration of n-type impurities is preferably equal to or less than $5 \times 10^{21}/cm^3$, in consideration of the output reduction of an LED. More preferably, the doping concentration of n-type impurities is equal to or less than $1 \times 10^{21}/cm^3$. As for the n-type impurities, Si, Ge, Sn and the like are used. Preferably, Si or Sn is used.

The $Ga_xSc_{(1-x)}N$ layer and the $Al_yGa_{(1-y)}N$ layer composing the electron emitting layer 230 may be doped with the n-type impurities in the same concentration or in different concentration.

As such, the electron emitting layer 230 can be obtained by growing a $Ga_xSc_{(1-x)}N/Al_yGa_{(1-y)}N$ layer ($0 \leq x < 1$ and $0 \leq y < 1$) which is a nitride semiconductor layer including a transition element of group III, such as Sc.

In the related art, the InGaN layer of the electron emitting layer composed of an InGaN/GaN layer cannot be grown at high temperature of more than 1000° C. because of a low binding force of InN. Therefore, it is difficult to secure excellent crystallinity. In the present invention, however, the electron emitting layer 230 is composed of a $Ga_xSc_{(1-x)}N$ layer including Sc which can be grown at high temperature of more than 1000° C. because it has a high melting point and a high binding force, instead of InGaN. Therefore, it is possible to secure more excellent crystallinity than an existing electron emitting layer composed of InGaN/GaN layer.

As for the transition element of group III to be included in the electron emitting layer 230, Y (yttrium) may be used instead of Sc. That is, the electron emitting layer 230 may be composed of a $Ga_xY_{(1-x)}N/Al_yGa_{(1-y)}N$ layer ($0 \leq x < 1$ and $0 \leq y < 1$) instead of a $Ga_xSc_{(1-x)}N/Al_yGa_{(1-y)}N$ layer ($0 \leq x < 1$ and $0 \leq y < 1$).

Since Y (yttrium) of the $Ga_xY_{(1-x)}N$ layer also has a high melting point and a high binding force, the $Ga_xY_{(1-x)}N$ layer can be grown at high temperature of more than 1000° C. Therefore, it is possible to secure more excellent crystallinity than an existing electron emitting layer composed of InGaN/GaN layer.

Meanwhile, the above-described electron emitting layer 230 of the nitride semiconductor LED according to the invention may not formed between the n-type nitride semiconductor layer 220 and the active layer 240, but may be formed between the active layer 240 and the p-type nitride semiconductor layer 250, as shown in FIG. 3. Further, the electron emitting layer 230 may be formed between the n-type nitride semiconductor layer 220 and the active layer 240 and between the active layer 240 and the p-type nitride semiconductor layer 250, as shown in FIG. 4. In FIG. 4, reference numerals 230a and 230b represent first and second electron emitting layers, respectively.

As such, the electron emitting layer 230 composed of at least one $Ga_xY_{(1-x)}N/Al_yGa_{(1-y)}N$ layer ($0 \leq x < 1$ and $0 \leq y < 1$) or $Ga_xSc_{(1-x)}N/Al_yGa_{(1-y)}N$ layer ($0 \leq x < 1$ and $0 \leq y < 1$), which can be grown at high temperature so as to secure excellent crystallinity, is grown in the vicinity of the active layer 240, thereby enhancing light emission efficiency and ESD characteristics of an LED.

The electron emitting layer 230 includes an $Al_yGa_{(1-y)}N$ layer which can be grown by using AlN and GaN.

FIG. 5 is a graph showing bandgap energy of AlN and GaN.

According to the invention, Al is inserted into the $Al_yGa_{(1-y)}N$ layer such that bandgap can be adjusted in various manners within a thick solid line shown in FIG. 5. That is, a bandgap difference from the $Ga_xSc_{(1-x)}N$ layer is further increased by inserting Al. Then, electron confinement is strengthened and a difference in current distribution is provided, so that the nitride semiconductor LED can be protected from a sudden surge voltage or static electricity. Therefore, it is possible to enhance ESD characteristics of an LED.

Second Embodiment

Hereinafter, a nitride semiconductor LED according to a second embodiment of the invention will be described in detail with reference to FIGS. 6 to 8.

FIGS. 6 to 8 are sectional views illustrating the structure of the nitride semiconductor LED according to the second embodiment of the invention, showing an example of a vertical nitride semiconductor LED.

As shown in FIG. 6, the nitride semiconductor LED has a p-electrode 260 formed in the lowermost portion thereof. Preferably, the p-electrode 260 is formed of metal with high reflectance so as to serve as an electrode and a reflecting layer.

On the p-electrode 260, a p-type nitride semiconductor layer 250, an active layer 240, an electron emitting layer 230, an n-type nitride semiconductor layer 220, and a substrate 200 are sequentially formed. On the substrate 200, an n-electrode 270 is formed.

The substrate 200 serves to induce spreading of carriers so as to reduce resistance. The substrate 200 may be formed of any one selected from the group consisting of a GaN substrate, an SiC substrate, a ZnO substrate, and a conductive substrate.

As described above, the p-type nitride semiconductor layer 250 may be formed of a GaN or GaN/AlGaN layer doped with p-type conductive impurities, the active layer 240 may be formed of an InGaN/GaN layer with a multi-quantum well (MQW) structure, and the n-type nitride semiconductor layer 220 may be formed of a GaN or GaN/AlGaN layer doped with n-type conductive impurities.

As described above, the electron emitting layer 230, which serves to reduce a driving voltage of an LED and to enhance light emission efficiency and ESD characteristics, may be formed of a nitride semiconductor layer including a transition element of group III.

As for the transition element of group III, Sc (scandium) or the like may be used. The nitride semiconductor layer including Sc may be formed of at least one $Ga_xSc_{(1-x)}N/Al_yGa_{(1-y)}N$ layer ($0 \leq x < 1$ and $0 \leq y < 1$).

The electron emitting layer 230 secures a high carrier mobility due to a bandgap difference between $Ga_xSc_{(1-x)}N$ layer and $Al_yGa_{(1-y)}N$ layer, thereby enhancing a current spreading effect. When a current spreading effect is enhanced, a driving voltage of an LED is reduced and light emission efficiency thereof increases so that the magnitude of ESD protection voltage increases.

When the electron emitting layer 230 is formed by laminating more than two $Ga_xSc_{(1-x)}N/Al_yGa_{(1-y)}N$ layers ($0 \leq x < 1$ and $0 \leq y < 1$), compositional ratios of Ga and Sc within $Ga_xSc_{(1-x)}N$ forming the respective layers may differ from each other, and compositional ratios of Al and Ga within $Al_yGa_{(1-y)}N$ forming the respective layers may differ from each other. Further, when the electron emitting layer 230 is formed by laminating more than two $Ga_xSc_{(1-x)}N/Al_yGa_{(1-y)}N$ layers ($0 \leq x < 1$ and $0 \leq y < 1$) as described above, the thicknesses of the respective $Ga_xSc_{(1-x)}N$ layers composing the electron emitting layer 230 may be equal to or different from each other.

Further, the thicknesses of the $Ga_xSc_{(1-x)}N$ layer and the $Al_yGa_{(1-y)}N$ layer composing the electron emitting layer 230 may be equal to or different from each other.

Preferably, all or some of the $Ga_xSc_{(1-x)}N/Al_yGa_{(1-y)}N$ layers composing the electron emitting layer 230 are doped with n-type impurities. The $Ga_xSc_{(1-x)}N$ layer and the $Al_yGa_{(1-y)}N$ layer may be doped with the n-type impurities in the same concentration or in different concentration. However, the $Ga_xSc_{(1-x)}N$ layer and the $Al_yGa_{(1-y)}N$ layer may not be doped with impurities.

The electron emitting layer 230 is composed of a $Ga_xSc_{(1-x)}N$ layer including Sc which can be grown at high temperature of more than 1000° C. because it has a high melting point and a high binding force. Therefore, it is possible to secure more excellent crystallinity than in an existing electron emitting layer composed of an InGaN/GaN layer.

As for the transition element of group III to be included in the electron emitting layer 230, Y (yttrium) may be used instead of Sc. A nitride semiconductor layer including Y (yttrium) may be composed of at least one $Ga_xY_{(1-x)}N/Al_yGa_{(1-y)}N$ layer ($0 \leq x < 1$ and $0 \leq y < 1$). Since Y (yttrium) of the $Ga_xY_{(1-x)}N$ layer also has a high melting point and a high binding force, the $Ga_xY_{(1-x)}N$ layer can be grown at high temperature of more than 1000° C. Therefore, it is possible to secure more excellent crystallinity than in an existing electron emitting layer composed of an InGaN/GaN layer.

Further, the above-described electron emitting layer 230 of the nitride semiconductor LED according to the invention may not formed between the n-type nitride semiconductor layer 220 and the active layer 240, but may be formed between the p-type nitride semiconductor layer 250 and the active layer 240, as shown in FIG. 7. Further, the electron emitting layer 230 may be formed between the p-type nitride semiconductor layer 250 and the active layer 240 and between the active layer 240 and the n-type nitride semiconductor layer 220, as shown in FIG. 8. In FIG. 8, reference numerals 230a and 230b represent first and second electron emitting layers, respectively.

In the second embodiment, the electron emitting layer 230 composed of at least one $Ga_xSc_{(1-x)}N/Al_yGa_{(1-y)}N$ layer ($0 \leq x < 1$ and $0 \leq y < 1$) or $Ga_xY_{(1-x)}N/Al_yGa_{(1-y)}N$ layer ($0 \leq x < 1$ and $0 \leq y < 1$), which can be grown at high temperature so as to secure excellent crystallinity, is grown in the vicinity of the active layer 240, thereby obtaining the same operation and effect as the second embodiment.

According to the nitride semiconductor LED of the invention, the electron emitting layer is formed of a $Ga_xSc_{(1-x)}N/Al_yGa_{(1-y)}N$ layer ($0 \leq x < 1$ and $0 \leq y < 1$) or $Ga_xY_{(1-x)}N/Al_yGa_{(1-y)}N$ layer ($0 \leq x < 1$ and $0 \leq y < 1$), which can be grown at high temperature so as to secure more excellent crystallinity than an existing InGaN/GaN layer. Therefore, it is possible to enhance light emission efficiency and ESD characteristics of an LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claim is:

1. A nitride semiconductor light emitting diode (LED) comprising:
   an n-type nitride semiconductor layer;
   an active layer formed on the n-type nitride semiconductor layer;
   an electron emitting layer formed on the active layer, wherein the electron emitting layer comprises at least a pair of a first nitride semiconductor layer including a transition element of group III and a second nitride semiconductor layer, and wherein the inclusion of the group III transition element increases the bandgap difference between the first nitride semiconductor and the second nitride semiconductor; and
   a p-type nitride semiconductor layer formed on the electron emitting layer.

2. A nitride semiconductor light emitting diode (LED) comprising:
   a substrate;
   an n-type nitride semiconductor layer formed on the substrate;

an active layer formed on a portion of the n-type nitride semiconductor layer;

an electron emitting layer formed on the active layer, wherein the electron emitting layer comprises at least a pair of a first nitride semiconductor layer including a transition element of group III and a second nitride semiconductor layer, and wherein the inclusion of the group III transition element increases the bandgap difference between the first nitride semiconductor and the second nitride semiconductor;

a p-type nitride semiconductor layer formed on the electron emitting layer;

a p-electrode formed on the p-type nitride semiconductor layer; and an n-electrode formed on the n-type nitride semiconductor layer where the active layer is not formed.

3. A nitride semiconductor light emitting diode (LED) comprising:

a p-electrode;

a p-type nitride semiconductor layer formed on the p-electrode;

an electron emitting layer formed on the p-type nitride semiconductor layer, wherein the electron emitting layer comprises at least a pair of a first nitride semiconductor layer including a transition element of group III and a second nitride semiconductor layer, and wherein the inclusion of the group III transition element increases the bandgap difference between the first nitride semiconductor and the second nitride semiconductor;

an active layer formed on the electron emitting layer;

an n-type nitride semiconductor layer formed on the active layer;

a substrate formed on the n-type nitride semiconductor layer; and an n-electrode formed on the substrate.

4. The nitride semiconductor LED according to claim 3, wherein the substrate is any one selected from the group consisting of a GaN substrate, an SiC substrate, a ZnO substrate, and a conductive substrate.

* * * * *